United States Patent [19]
Yamashita et al.

[11] Patent Number: 6,072,206
[45] Date of Patent: Jun. 6, 2000

[54] SOLID STATE IMAGE SENSOR

[75] Inventors: Hirofumi Yamashita, Cambridge, Mass.; Ikuko Inoue, Kawasaki, Japan; Tetsuya Yamaguchi, Yaokohama, Japan; Hisanori Ihara, Yokohama, Japan; Hidetoshi Nozaki, Yokohama, Japan

[73] Assignee: Kabushiki Kaisha Toshiba, Kawasaki, Japan

[21] Appl. No.: 09/272,339

[22] Filed: Mar. 19, 1999

[30] Foreign Application Priority Data

Mar. 19, 1998 [JP] Japan .................................. 10-070808

[51] Int. Cl.[7] ........................ H01L 31/062; H01L 31/113
[52] U.S. Cl. ............................ 257/292; 257/443; 257/463
[58] Field of Search ..................................... 257/291, 292, 257/443, 461, 463

[56] References Cited

U.S. PATENT DOCUMENTS 5,904,493  5/1999  Lee et al. .................................... 438/57
6,023,293  2/2000  Watanabe et al. ....................... 348/294

*Primary Examiner*—Nagân V. Ngô
*Attorney, Agent, or Firm*—Olbon, Spivak, McClelland, Maier & Neustadt, P.C.

[57] ABSTRACT

The present invention provides a solid state image sensor constructed in such a manner that, even if the impurity concentration of the wells of a transistors is increased, the junction leakage current does not increase, and thus, the picture quality of the reproduced picture is not deteriorated. On a p-type substrate, there are formed a first p-type well for a photoelectric conversion portion comprising a photodiode, and a second p-type well for a signal scanning circuit portion. In the surface portions of the first and second p-type wells, a first and a second n-type diffused layers are formed, respectively. The drain of a reset transistor and the drain of an amplifying transistor which constitute the second n-type diffused layer are connected to a power supply line. Further, the source of an address transistor which is an n-type diffused layer is connected to a vertical signal line. The gates of the amplifying transistor and the address transistor are formed between second n-type diffused layers disposed at predetermined intervals on the surface of the second p-type well.

10 Claims, 5 Drawing Sheets

SOLID STATE IMAGE SENSOR

BACKGROUND OF THE INVENTION

The present invention relates to a MOS type solid state image sensor and, more particularly, a solid state image sensor constituted in such a manner that the picture quality of reproduced pictures can be improved.

FIG. 1 is a diagram showing an example of the circuit arrangement of a general solid state image sensing device known as amplification type MOS sensor.

Referring to FIG. 1, the solid state image sensing device shown is constituted in such a manner that unit cells which respectively consist of photodiodes $2_{11}$, $2_{12}$, $2_{13}$, $2_{21}$, $2_{22}$, $2_{23}$, $2_{31}$, $2_{32}$ and $2_{33}$, amplifying transistors $4_{11}$, $4_{12}$, $4_{21}$, $4_{22}$, $4_{23}$, $4_{31}$, $4_{32}$ and $4_{33}$ for reading the signals from the photodiodes $2_{11}$, $2_{12}$, ..., $2_{32}$ and $2_{33}$, vertical selection transistors $6_{11}$, $6_{12}$, $6_{13}$, $6_{21}$, $6_{22}$, $6_{23}$, $6_{31}$, $6_{32}$ and $6_{33}$ for selecting the lines for reading the signals, and reset transistors $8_{11}$, $8_{12}$, $8_{13}$, $8_{21}$, $8_{22}$, $8_{23}$, $8_{31}$, $8_{32}$ and $8_{33}$ for resetting the signal charging are disposed in a 3×3 two-dimensional state. In the case indicated above, 3×3 unit cells are shown, but, in actuality, a larger number of unit cells are disposed.

Horizontal address lines $12_1$, $12_2$ and $12_3$ disposed extending in the horizontal direction from a vertical shift register 10 are connected to the gates of the vertical selection transistors $6_{11}$, $6_{12}$, ..., $6_{32}$ and $6_{33}$, respectively, whereby the line for reading out the signal out is determined. Further, reset lines $14_1$, $14_2$ and $14_3$ are connected to the gates of the reset transistors $8_{12}$, $8_{22}$, ..., $8_{32}$ and $8_{33}$, respectively.

The sources of the amplifying transistors $4_{11}$, $4_{12}$, ..., $4_{32}$ and $4_{33}$ are connected to vertical signal lines $16_1$, $16_2$ and $16_3$, respectively, and, to one-side ends of the respective signal lines, load transistors $18_1$, $18_2$ and $18_3$ are connected. The other ends of the vertical signal lines $16_1$, $16_2$ and $16_3$ are connected to a horizontal signal line 24 through horizontal selection transistors $22_1$, $22_2$ and $22_3$ which are each selected by a selection pulse fed from a horizontal shift register 20.

The circuit which is constituted as described above operates as follows:

An address pulse which makes the horizontal address line $12_1$, $12_2$ or $12_3$ high in level is applied to it from the vertical shift register 10, as a result of which only the vertical selection transistors on the particulars line are turned on. Then, by the respective amplifying transistor on the thus selected line and the associated load transistor, a source follower circuit is constituted, and thus, a voltage approximately equal to the gate voltage of the amplifying transistor, that is, the voltage of the photodiode appears on the vertical signal line.

Next, from the horizontal shift register 20, horizontal selection pulses are successively applied to the horizontal selection transistors $22_1$, $22_2$ and $22_3$, and thus, from the horizontal signal line 24, signals corresponding to one line are successively taken out from the horizontal signal line 24. This operation is continuously carried out for the succeeding lines one after another, whereby all the signals in a two-dimensional state can be read out.

However, in the case of this type of device, there is the following drawback.

That is, all the transistors, not to speak of the amplifying transistors, disposed in the respective cells are reduced in dimensions as the structural minuteness of the cells is enhanced. Further, as the structural minuteness of the transistors is thus enhanced, the wells concentration in which the transistors are formed cannot but be increased. This is because, if otherwise, this (the enhancement in the wells concentration) would result in making further serious the drawbacks, such as the so-called short-channel effect and the so-called narrow-channel effect, caused through the enhancement of the structural minuteness.

On the other hand, it has been found that, if, in the respective photodiode which constitute a photo-electric conversion portion, the well concentration is increased, as in the case of the signal scanning portion, as the result of such enhancement in structural minuteness of the cells, then the following inconveniences will result:

FIG. 2 is a characteristic diagram illustrating the relationship between the well concentration and the junction leakage current of such a photo diode. From FIG. 2, it is understood that, in the case of the photodiode, as the well concentration is increased, the junction leakage current thereof increases. If the junction leakage current thus increases, then there is caused a so-called dark state in which the amount of signal in the device is scanty, which results in the generation of noises; and thus, the picture-quality of the reproduced pictures is conspicuously deteriorated.

That is, in the case of conventional MOS sensor, the transistors constituting the signal scanning circuit must also be made into minute structure when the picture elements are made structurally further minute. Further, in order to make such minute-structure transistors operate without being affected by the two-dimensional effects, the well concentration in which the transistors are formed must be enhanced.

In the case of the photodiode which constitute a photoelectric conversion portion, if the well concentration is enhanced, then the junction leakage current increases, as mentioned above, which results in the generation of noises on the reproducing screen, thus greatly deteriorating the picture quality of the reproduced picture. This has been a drawback.

BRIEF SUMMARY OF THE INVENTION

Thus, it is the object of the present invention to provide solid state image sensors each constituted in such a manner that, in making the transistors minute in structure in step with the minute-structuring of the cells, it is ensured that, even if the impurity concentrations of the wells of the transistors are enhanced, the junction leakage current does not increase and is thus prevented from resulting in the generation of noises on the reproducing screen to greatly deteriorate the picture quality of the reproduced picture.

A first object of the present invention is provide
 a solid-state image sensor on a semiconductor substrate comprises,
  a photoelectric conversion portion having a region of a first conductivity type which is the same conductivity type as that of the signal charges, and a first well region of a second conductivity type which is opposite to the first conductivity type, and
  a signal scanning circuit having at least one transistor, the at least one transistor is formed in a second well region of the second conductivity type opposite to the conductivity type of the transistor, wherein
   the impurity concentration of the first well in the photoelectric conversion portion and the impurity concentration of the second well in the signal scanning circuit differ from each other.

A second object of the present invention is to provide
 a solid-state image sensor, on a semiconductor substrate comprises, at least one photoelectric conversion portion having a first well; a signal scanning circuit portion having a second well; and, an element driving circuit portion having a third well, wherein the impurity concentrations of the first to third wells differ from one another.

A third object of the present invention is to provide a solid-state image sensor which has, on a semiconductor substrate, an image sensing region constituted in such a manner that unit cells, which are arranged in rows and columns and each comprise a photoelectric conversion portion and a signal scanning circuit portion, are disposed in a two-dimensional state; a drive circuit region in which there is disposed an element driving circuit for driving the signal scanning circuit of the image sensing region; and signal lines for reading out signals from the respective cells of the image sensing region, wherein the well constituting the element in the image sensing region includes a first well provided common to at least the photoelectric conversion portion and the signal scanning circuit portion, a second well provided in the photoelectric conversion portion, a third well provided in the signal scanning portion, and a fourth well provided in the element driving circuit portion.

In the solid state image sensor according to the present invention, the impurity concentration of the well in the photoelectric conversion portion is set so as to be lower than the well concentration of in the signal scanning circuit portion. Due to this, even in case the well concentrations in the signal scanning circuit portion is set to a concentration value sufficiently high to make the transistor operate without being affected by the two-dimensional effects, the well concentration in the photoelectric conversion portion can be set so as to be lower than the well concentrations in the signal scanning circuit portion. Therefore, the junction leakage current of the photodiode in the photoelectric conversion portion can be held low; and thus, the cells can be made into a minute structure, keeping the dark state noises due to the junction leakage current low.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described by reference to the drawings.

Figure 1:
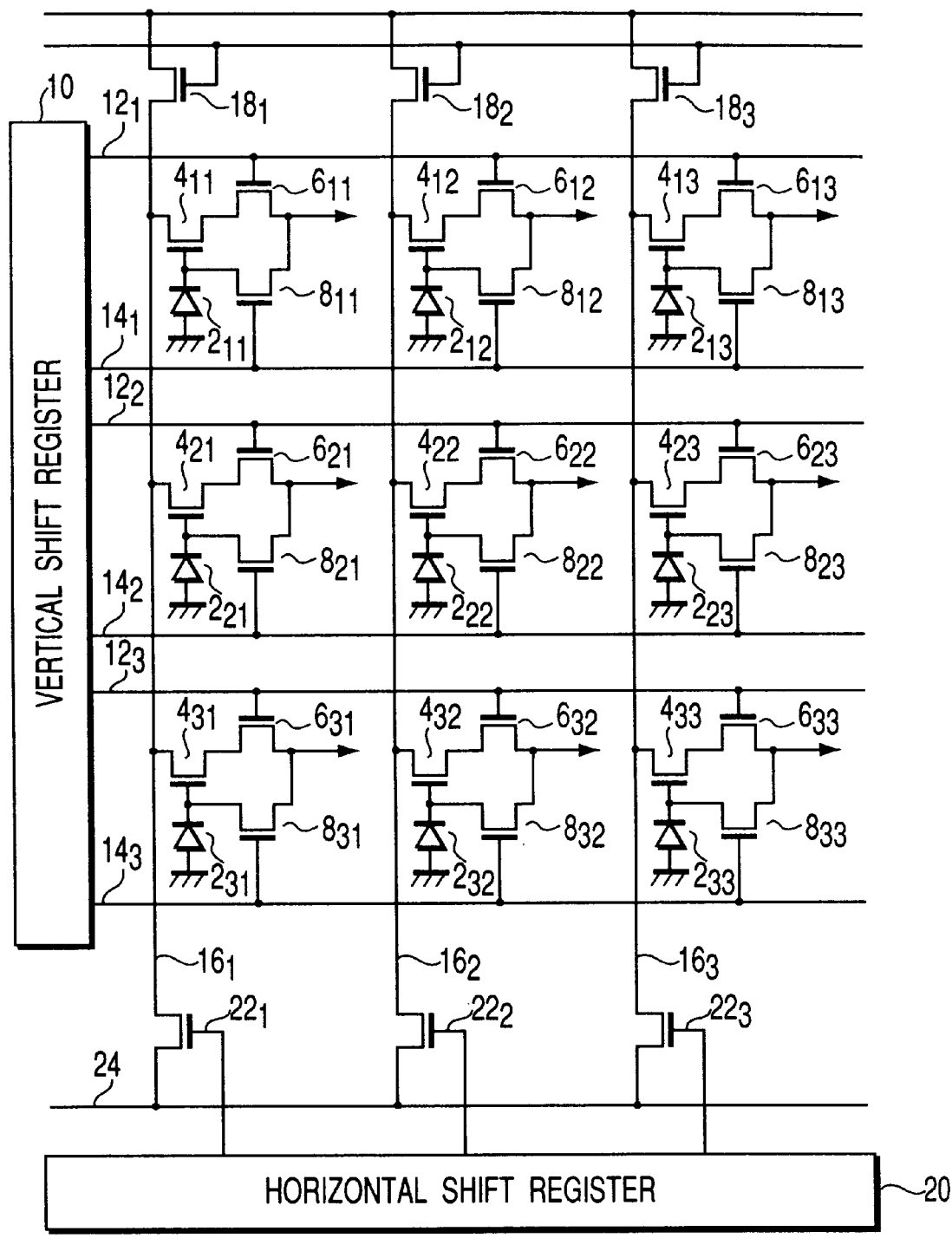
FIG. 1 is a diagram showing an example of the circuit arrangement of a conventional solid state imaging device known as amplification type MOS sensor.
Figure 2:
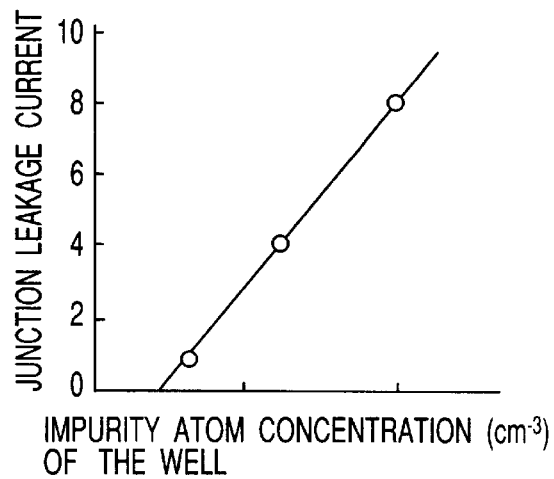
FIG. 2 is a characteristic diagram illustrating the relationship between the well concentration and the junction leakage current in the photodiodes in a conventional solid state imaging device.
Figure 3:
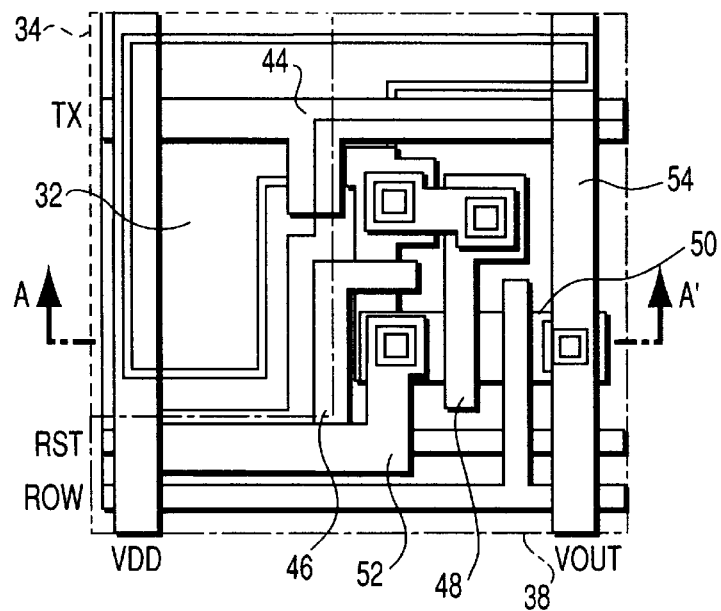
FIG. 3 is a plan view showing the structure of the unit cell according to a first embodiment of the solid state image sensor according to the present invention.
Figure 4:
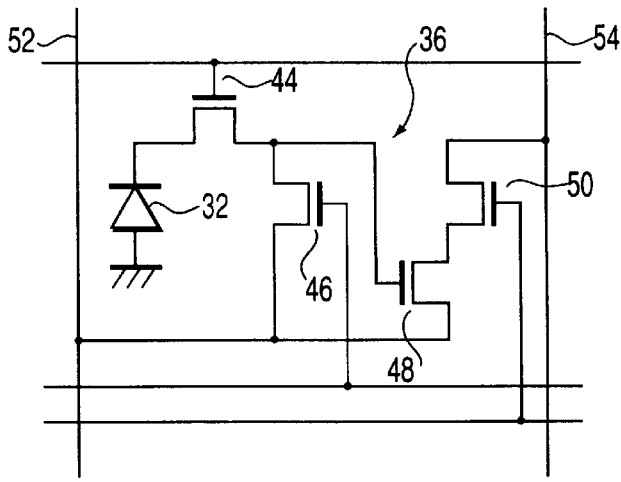
FIG. 4 is a circuit diagram which shows the structure of the unit cell, corresponding to FIG. 3.
Figure 5:
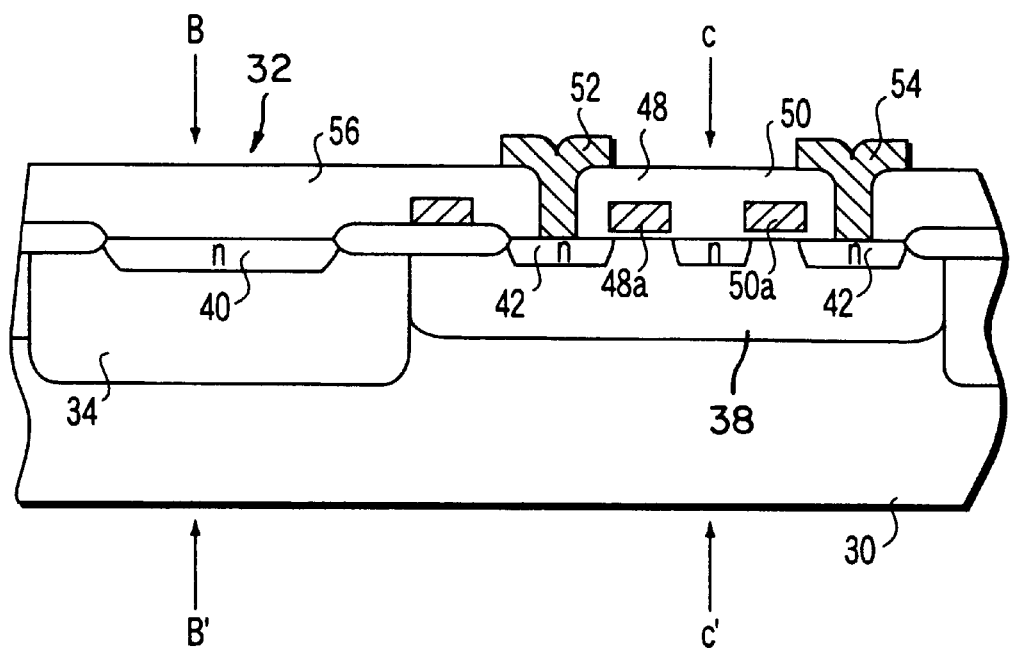
FIG. 5 is a sectional view taken along the line A–A' in FIG. 3.

FIG. 3 is a plan view showing the structure of the unit cell according to a first embodiment of the solid state image sensor of the present invention, FIG. 4 is a circuit diagram which shows the structure of the unit cell, corresponding to FIG. 3, and FIG. 5 is a sectional view taken along the line A–A' in FIG. 3.

As shown in FIGS. 3 to 5, a p-type well 34 and a p-type well 38 are formed in the p-type substrate 30. The p-type well 34 is formed in a photoelectric conversion portion. A signal scanning circuit portion 36 is formed also in the photoelectric conversion portion. A photodiode 32 is formed in the p-type well 38. In the surface portions of the p-type wells 34 and 38, n-type diffused layers 40 and 42 are formed as shown. The junction depth of the p-type well 38 at the side of the signal scanning circuit portion 36 is set so as to be smaller than that of the p-type well 34 in the photoelectric conversion portion.

The cathode of the photodiode 32 is connected to the source of a transfer transistor 44. The drain of the transfer transistor 44 is connected to the source of a reset transistor 46 and the gate of an amplifying transistor 48. Further, connected to the source of this amplifying transistor 48 is the drain of an address transistor 50.

The drain of the reset transistor 46 and the drain of the amplifying transistor 48 which constitute the n-type diffused layers 42 are connected to a power supply line 52. Further, the source of the address transistor 50 which is an n-type diffused layer 42 is connected to a vertical signal line 54. The respective gates 48a and 50a of the amplifying transistor 48 and the address transistor 50 are formed in such a manner as to be positioned on the surface of the p-type well 34 and approximately between the plurality of n-type diffused layer 42 disposed at predetermined intervals. Further, the reference numeral 56 denotes an interlayer film.

Figure 6A:
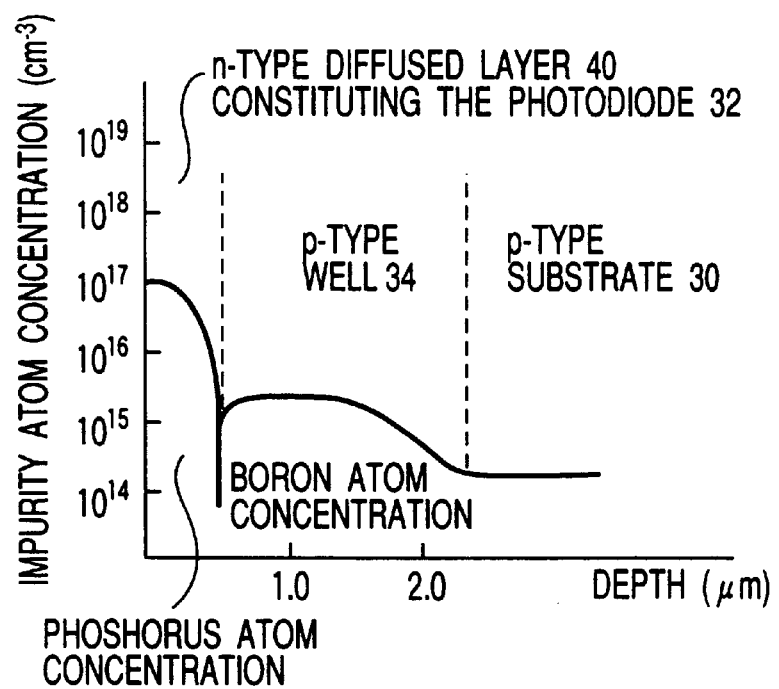
FIG. 6A is a diagram showing the impurity concentration profile in the section taken along the line B–B' extending through the photodiode 32 which constitutes the photoelectric conversion portion shown in FIG. 5.
Figure 6B:
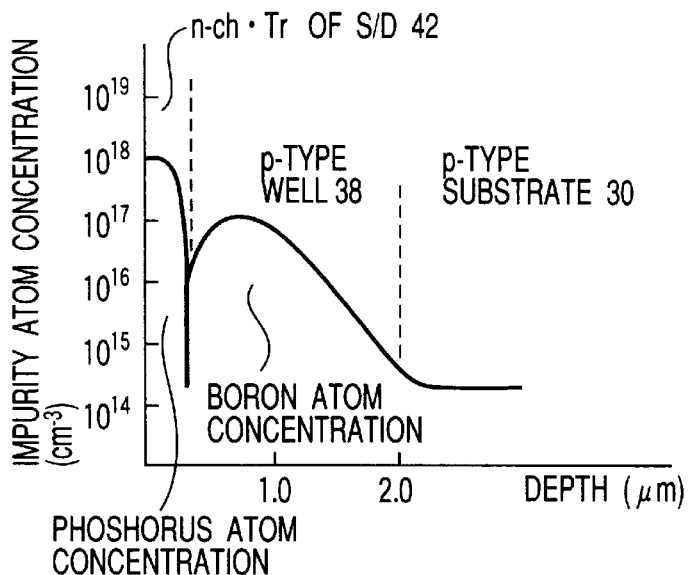
FIG. 6B is a diagram showing the impurity concentration profile in the section taken along the line C–C' extending through the scanning circuit portion.

FIG. 6A is a diagram showing the impurity concentration profile in the section taken along the line B–B' extending through the photodiode 32 which constitutes the photoelectric conversion portion shown in FIG. 5, and FIG. 6B is a diagram showing the impurity concentration profile in the sectiontaken along the line C–C' extending through the scanning circuit portion 36.

As shown in FIG. 6B, the atom concentration of boron in the p-type well 38 of the signal scanning circuit portion 36 in the unit cell which is constituted as described above is on the order of $10^{17}$ (cm$^{-3}$). This impurity concentration is an impurity concentration at which the MOS circuit with a design standard of 0.7 μm operates without causing a short-channel effect etc. Accordingly, at this impurity concentration of the p-type well 38, the signal scanning circuit operates without any inconvenience and thus can read the signal.

Figure 6C:
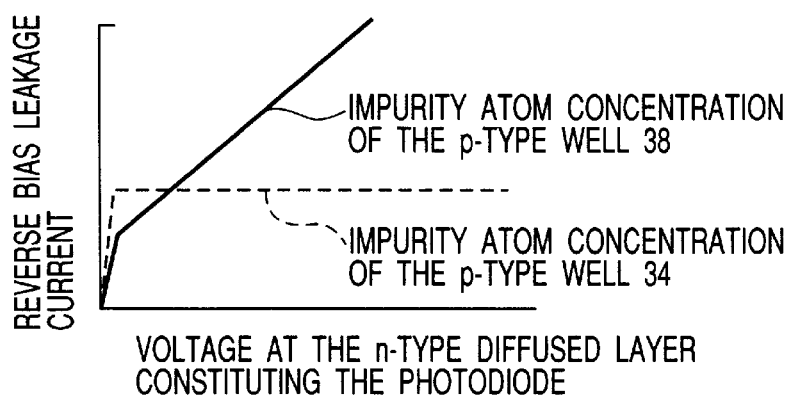
FIG. 6C is a diagram showing the reverse bias leakage currents caused under the impurity concentration profiles in the sections taken along the lines B–B' and C–C' in FIG. 5 and the respective p-type well concentrations.

On the other hand, the impurity concentration of the p-type well 34 in the photoelectric conversion portion (photodiode 32) for example is on the order of $10^{15}$ (cm$^{-3}$) as may be understood from FIG. 6. At this impurity concentration, the leakage current of the pn junction becomes sufficiently small as shown in FIG. 6C. Therefore, there is no problem concerning the noises during the dark time; and thus, an image sensor with a high sensitivity can be realized.

As seen above, in the signal scanning circuit portion within the screen, the impurity concentration of the well is set to a concentration value sufficiently high for the signal scanning circuit portion to operate without the occurrence of a short-channel effect in the MOS circuit incorporated in the minute picture element, and, in the photoelectric conversion portion, the well concentration is lowered down to a concentration value at which the leakage current becomes sufficiently small, whereby it becomes possible to realize an imaging device which has low noises with minute picture elements.

Further, the depth of the p-type well 38 at the side of the scanning circuit portion 36 is set so as to be small with respect to that of the p-type well 34 at the photoelectric conversion side, so that it is possible to prevent the manufacturing steps from becoming long, in view of the case where the p-type well 38 is formed with the same depth as that of the p-type well 34.

Further, in the case of the structure of the cell shown in FIG. 5, the conductivity type of the substrate 30 is the same p-type as that of the wells, but the conductivity type of the substrate may alternatively be the n type.

Figure 7:
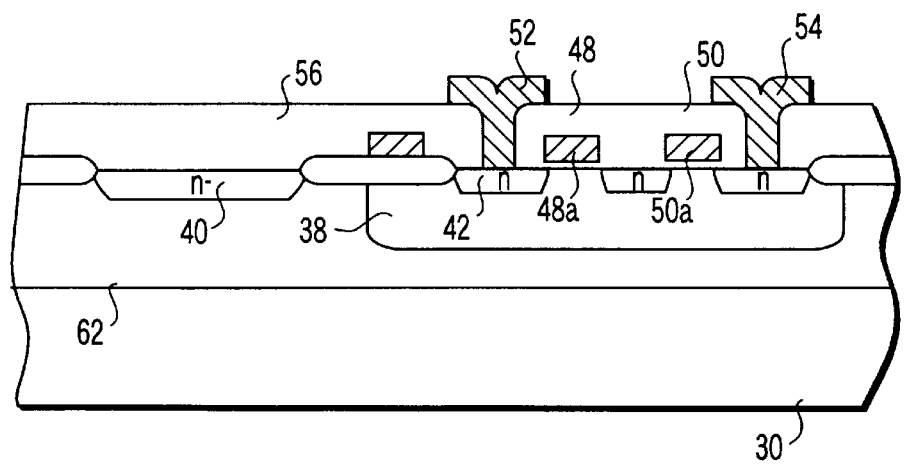
FIG. 7 is a sectional view showing the structure of the unit cell according to a second embodiment of the solid state image sensor of the present invention.

FIG. 7 is a sectional view showing the structure of the unit cell according to a second embodiment of the solid state image sensor of the present invention. In the following description to this embodiment, the same portions as those of the foregoing first embodiment will be referenced by the same reference numerals, whereby the description thereof will be omitted.

The second embodiment shown in FIG. 7 differs from the first embodiment shown in FIG. 5 in that, in the former, a p-type well 62 provided in the photoelectric conversion portion is used in common with the signal scanning circuit portion.

Further, in the structure shown in FIG. 7, the conductivity type of the substrate 30 is the same p-type as that of the well, but the conductivity type of the substrate may alternatively be the n-type.

Figure 8:
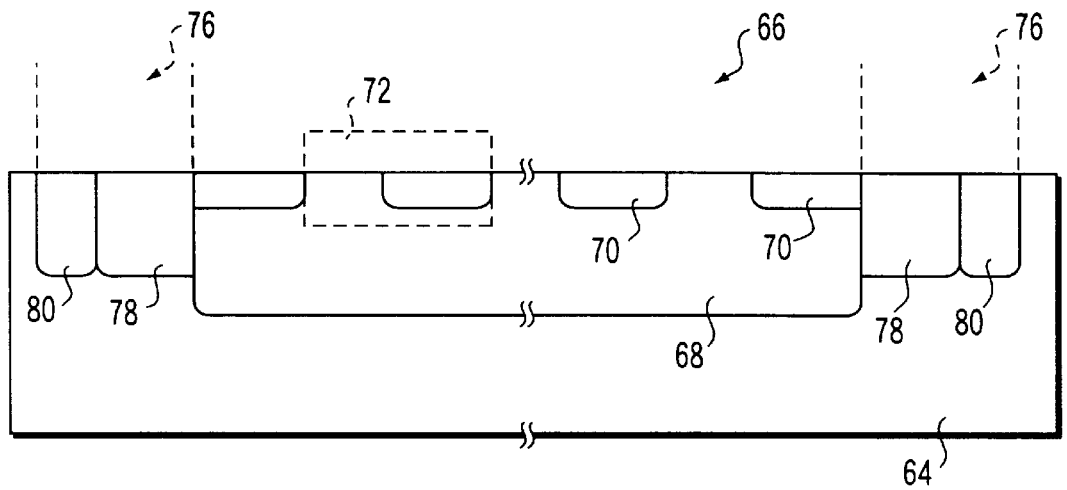
FIG. 8 is a sectional view of the device structure showing the well structure according to a third embodiment of the solid state image sensor of the present invention.

FIG. 8 is a sectional view of device structure showing the well structure according to a third embodiment of the solid state image sensor of the present invention.

Referring to FIG. 8, a p-type well 68 is formed in an image sensing region 66 of a p-type substrate 64, and, in the signal scanning circuit portion formed in the surface portion of this p-type well 68, a plurality of p-type wells 70 are provided at predetermined intervals. Numeral 72 denotes a unit picture element.

On the other hand, in an element driving region 76 lying in the surface portion of the p-type substrate 64 and outside of the p-type well 68, a p-type well 78 and an n-type well 80 are formed, respectively. The p-type well 78 and the n-type well 80 are formed in such a manner that, at a position adjacent to the p-type well 68, the p-type well 78 is located, and, adjacent to the p-type well 78 (at the opposite side of the p-type well 78 with reference to the position of the p-type well 68), the n-type well 80 is formed.

The impurity concentration of the p-type wells 70 is set so as to be lower than the impurity concentration of the p-type well 68, and the impurity concentration of the p-type well 68 is set so as to be lower than the impurity concentration of the p-type well 78.

Figure 9:
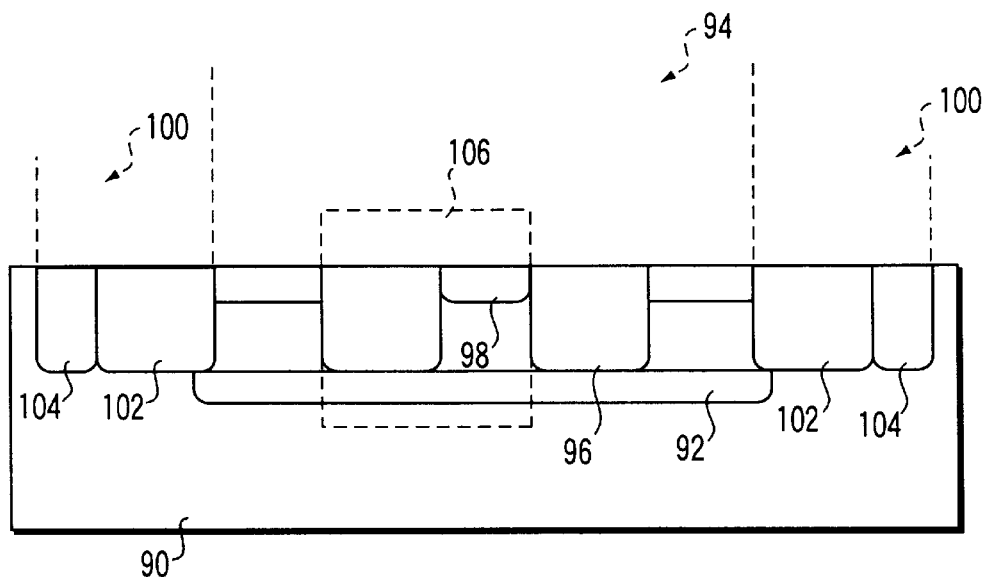
FIG. 9 is a diagram showing the well structure according to a fourth embodiment of the solid state image sensor of the present invention.

FIG. 9 is a diagram showing the well structure according to a fourth embodiment of the solid state image sensor of the present invention.

Referring to FIG. 9, at a predetermined distance from the surface portion of a p-type substrate 90, a p-type well 92 is formed common to the photoelectric conversion portion and the signal scanning circuit portion. Further, provided in an image sensing region 94 of the surface portion of the p-type substrate 90 is a p-type well 96 in the photoelectric conversion portion and a p-type well 98 in the signal scanning circuit portion.

On the other hand, in an element driving circuit portion 100 in the surface portion of the p-type substrate 90, a p-type well 102 of the element driving circuit portion 100 and an n-type well 104 of the element driving circuit portion 100 are formed, respectively. Numeral 106 denotes a unit picture element.

The impurity concentrations of the respective p-type wells mentioned above differ from one another.

Further, in the case of this fourth embodiment, the conductivity type of the substrate 90 is the p type, but this may alternatively be the n type.

As may be apparent from the above, the second to fourth embodiments each also have the same effect as that of the first embodiment.

The present invention is not limited only to the foregoing embodiments but can be variously modified.

As stated above, according to the present invention, in view of minute-structuring the transistors in order to make the cells structurally minute in dimensions, there can be provided a solid state image sensor constructed in such a manner that, despite the fact that the impurity concentration of the wells of the transistors is enhanced, the junction leakage current does not increase, so that it is prevented from resulting in the generation of noises on the reproducing screen to greatly deteriorate the picture quality of the reproduced picture.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image sensor on a semiconductor substrate comprises, a photoelectric conversion portion having a region of a first conductivity type which is the same conductivity type as that of the signal charges, and a first well region of a second conductivity type which is opposite to the first conductivity type, and a signal scanning circuit having at least one transistor, the at least one transistor is formed in a second well region of the second conductivity type opposite to the conductivity type of the transistor, wherein the impurity concentration of the first well in the photoelectric conversion portion and the impurity concentration of the second well in the signal scanning circuit differ from each other.

2. The solid state image sensor according to claim 1, wherein the impurity concentration of the first well in the photoelectric conversion portion is lower than the impurity concentration of the second well in the signal scanning circuit.

3. The solid state image sensor according to claim 2, wherein the junction depth of the first well in the photoelectric conversion portion is greater than that of the second well in the signal scanning circuit.

4. The solid state image sensor according to claim 1, wherein the first well in the photoelectric conversion portion is formed in a state extended to the region beneath the second well in the signal scanning circuit.

5. The solid state image sensor according to claim 4, wherein the impurity concentration of the first well in the photoelectric conversion portion is lower than the impurity concentration of the second well in the signal scanning circuit.

6. A solid-state image sensor on a semiconductor substrate comprises, at least one photoelectric conversion portion having a first well; a signal scanning circuit portion having a second well; and, an element driving circuit portion having a third well, wherein the impurity concentrations of the first to third wells differ from one another.

7. The solid state image sensor according to claim 6, wherein the impurity concentration of the first well is set so as to be lower than the impurity concentration of the second well, and the impurity concentration of the second well is set so as to be lower than the impurity concentration of the third well.

8. The solid state image sensor according to claim 7, wherein the junction depth of the second well is greater than that of the third well.

9. A solid-state image sensor which has, on a semiconductor substrate, an image sensing region constituted in such a manner that unit cells, which are arranged in rows and columns and each comprise a photoelectric conversion portion and a signal scanning circuit portion, are disposed in a two-dimensional state; a drive circuit region in which there is disposed an element driving circuit for driving the signal scanning circuit of the image sensing region; and signal lines for reading out signals from the respective cells of the image sensing region, wherein the well constituting the element in the image sensing region includes a first well provided common to at lest the photoelectric conversion portion and the signal scanning circuit portion, a second well provided in the photoelectric conversion portion, a third well provided in the signal scanning portion, and a fourth well provided in the element driving circuit portion.

10. The solid state image sensor according to claim 9, wherein the impurity concentrations of the first well, the second well, the third well and the fourth well differ from one another.

* * * * *